United States Patent [19]

Pammer

[11] Patent Number: 4,680,610
[45] Date of Patent: Jul. 14, 1987

[54] SEMICONDUCTOR COMPONENT COMPRISING BUMP-LIKE, METALLIC LEAD CONTACTS AND MULTILAYER WIRING

[75] Inventor: Erich Pammer, Taufkirchen, Fed. Rep. of Germany

[73] Assignee: Siemens Aktiengesellschaft, Berlin and Munich, Fed. Rep. of Germany

[21] Appl. No.: 663,364

[22] Filed: Oct. 22, 1984

[30] Foreign Application Priority Data

Nov. 30, 1983 [DE] Fed. Rep. of Germany ....... 3343367

[51] Int. Cl.⁴ .................... H01L 23/50; H01L 29/40
[52] U.S. Cl. ........................................ 357/68; 357/71; 357/65; 357/54
[58] Field of Search ............... 357/71, 68, 65, 54

[56] References Cited

U.S. PATENT DOCUMENTS 4,263,606 4/1981 Yorikane ........................... 357/71

FOREIGN PATENT DOCUMENTS 54-73561 6/1979 Japan ...................... 357/65

Primary Examiner—Andrew J. James
Assistant Examiner—John Lamont
Attorney, Agent, or Firm—Hill, Van Santen, Steadman & Simpson

[57] ABSTRACT

A semiconductor component having bump-like, metallic lead contacts and multilayer wiring wherein individual tracks of each and every electrical signal or potential to be wired in multilayer wiring technology are electrically connected to the respective lead contact in the region thereof and to one another, but are separated from one another in the remaining regions of the semiconductor component by insulating layers. The various insulating layers terminate at different distances from the lead contacts in such fashion that their ends, depending upon the embodiment, form a funnel that tapers either down or up. The difference of the respective distance of the ends of two neighboring insulating layers from the corresponding lead contacts amounts to at least twice the thickness of one of the two layers. Given different layer thicknesses, a dimension of the thicker layer is used. An insulating layer may be at most 2 μm thick, and preferably 1 μm. Edge interruptions at the tracks and sputtering gaps and voids at the lead contacts which lead to contact causticization, corrosion, and subsequent electrical failure are thus avoided.

11 Claims, 3 Drawing Figures

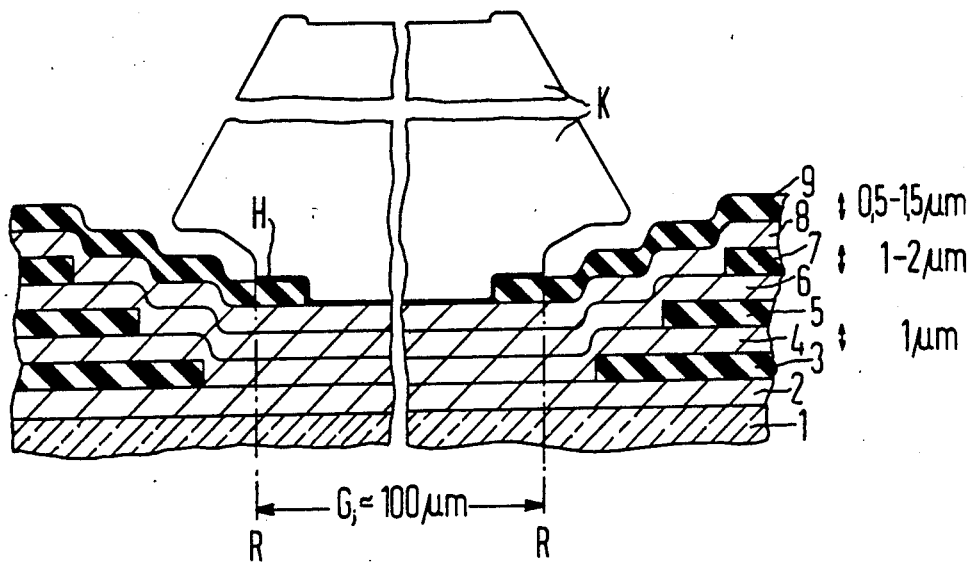
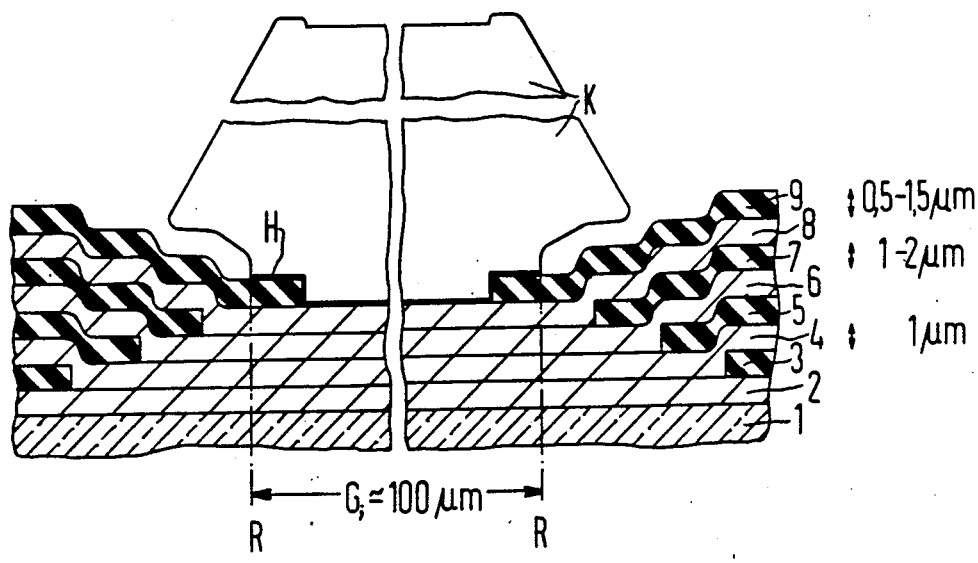

SEMICONDUCTOR COMPONENT COMPRISING BUMP-LIKE, METALLIC LEAD CONTACTS AND MULTILAYER WIRING

BACKGROUND OF THE INVENTION

The invention relates to a semiconductor component having bump-like, metallic lead contacts and multilayer wiring wherein the multilayer wiring is formed of a plurality of conductive tracks with insulating layers therebetween. At a given contact location, various ones of the conductive tracks are commonly connected to a corresponding lead contact.

As is known, electronic semiconductor circuits must be connected to the other parts of an electrical circuit when used, this occurring, for example, by means of solder or wire bonds. Due to the risk of damage, however, this connection is generally not produced directly at the semiconductor component (chip) of such a semiconductor circuit but at a "connecting piece". Such a connecting piece is, for example, a contact dot on the carrier in a so-called micropack construction. This design is well known in the semiconductor industry. It avoids an otherwise necessary direct mechanical access of the component purchaser to the semiconductor component of the semiconductor circuit. The connecting of the contact dot to a corresponding lead contact on the semiconductor component itself, which is still required, is still carried out by the manufacturer of the component in a simultaneous work step for all contact terminals of the component. The procedure is called automatic tape bonding. The contact terminals of the semiconductor component are thus designed as metallic bumps or pillars, and may be formed of a plurality of materials under given conditions, of which at least the uppermost layer is well-solderable or thermocompressible, and either are formed of gold, are coated with a gold layer (contacting ensues via thermocompression), or have at least their surface formed of a solderable material such as gold, silver or copper coated with tin or a lead-tin alloy. They can be situated both at the edge of the semiconductor component, in the so-called inactive region, or can also be situated in the active region thereof.

The increasing complexity and the increasing component density of integrated semiconductor components has led to the fact that the signal and potential management within these components now frequently occurs in so-called multilayer technology in contrast to the earlier single layer technology. The electrical signals and potentials that are employed are thus no longer conducted in only one level but in a plurality of conductive layers respectively separated by electrically insulating layers such as, for example, silicon dioxide, silicon nitride, or various polyimides. The connection of individual layers having identical signals or potentials is thus predominantly provided in the region of the respective lead contact.

Given semiconductor technologies previously standard, as shown in FIG. 1, essentially the following layers then come to lie under an area G of the lead contacts:

1. electric tracks or interconnects 2, 4, 6, and 8 under the entire area G;

2. insulating layers 3, 5, and 7 in such form that they respectively have a large opening under the area G within which parts of the tracks 4, 6, and 8 lie;

3. a so-called final passivation layer 9 on the uppermost track 8, this likewise having a large opening under the area G.

The area G of the lead contacts K is thus defined as the horizontal section plane through a lead contact at that height in which the lead contact has its greatest horizontal expanse on the final passivation layer 9.

In the manufacture of the known semiconductor component, the insulating layers 3, 5, and 7 and the final passivation layer 9 are first applied surface-wide and are then in turn etched off in a sub-region of the area G of the lead contacts K to be applied later, so that cylindrical or cuboid contact holes arise, the contact holes being partially filled with the tracks 4, 6, and 8 of the multilayer wiring formed, for example, of aluminum, aluminum with up to a 4% silicon or a copper constituent, or metal sequences such as titanium, platinum, gold, and/or electrically conductive silicides. Due to the openings in the insulating layers 3, 5, and 7, the tracks 4, 6 and 8 and the insulating layers 3, 5, and 7 thus form steps having a height of more than 3 $\mu$m. This can lead to track interruptions U causing reliability and functional problems, and even complete electrical failure.

Applied as the uppermost layer to this arrangement in the region of the area G of the lead contacts K by means of vapor-deposition or sputtering is a 0.1 to 2 $\mu$m thin metallic layer sequence as an adhesion layer H and diffusion barrier. It is applied between the track 8 and the final passivation layer 9 and the metallic, bump-like lead contacts K to be provided. The lead contacts K themselves are generated in surface-wide fashion, for example by means of sputtering, or by means of electro-deposition in combination with phototechnique steps. In the case of surface-wide sputtering, they are in turn etched off in those regions outside of the lead contacts K to be produced. Due to the afore-mentioned step heights of greater than 3 $\mu$m, and proceeding from the lateral edges of the contact holes, are so-called sputtering gaps S or voids which pass vertically up through the lead contacts K and at which etching agent and electrolyte can then penetrate. This leads to contact causticization, corrosion, and subsequent electrical failure of the semiconductor component.

SUMMARY OF THE INVENTION

An object of the present invention is to alleviate this situation and to create a semiconductor component with bump-like metallic lead contacts and multilayer wiring wherein these interruptions at edges as well as sputtering gaps or voids cannot appear, and consequently wherein the described contact causticizations and corrosion are also reliably avoided.

Given a semiconductor component of the type initially cited, this object is achieved by means of providing individual insulating layers at a given contact location which terminate in a horizontal direction at different distances from an imaginary, vertical projection line of an edge of an area of the lead contact defined by a horizontal plane of section at a height at which the lead contact has its greatest horizontal expanse on a final passivation layer lying therebelow. By terminating the insulating layers at different distances, the steps formed have a minimized height as compared to the prior art.

When etching the insulating layers, one succeeds in creating steps with a height sufficient to prevent the track interruptions as well as the occurrence of sputtering gaps and voids when vapor-depositing the lead contacts.

BRIEF DESCRIPTION OF THE DRAWINGS

FIG. 2 is a cross-sectional view of a semiconductor component with the bump-like metallic lead contact system according to the invention; and FIG. 3 is a cross-sectional view of another embodiment of FIG. 2.

DESCRIPTION OF THE PREFERRED EMBODIMENTS

Figure 1:
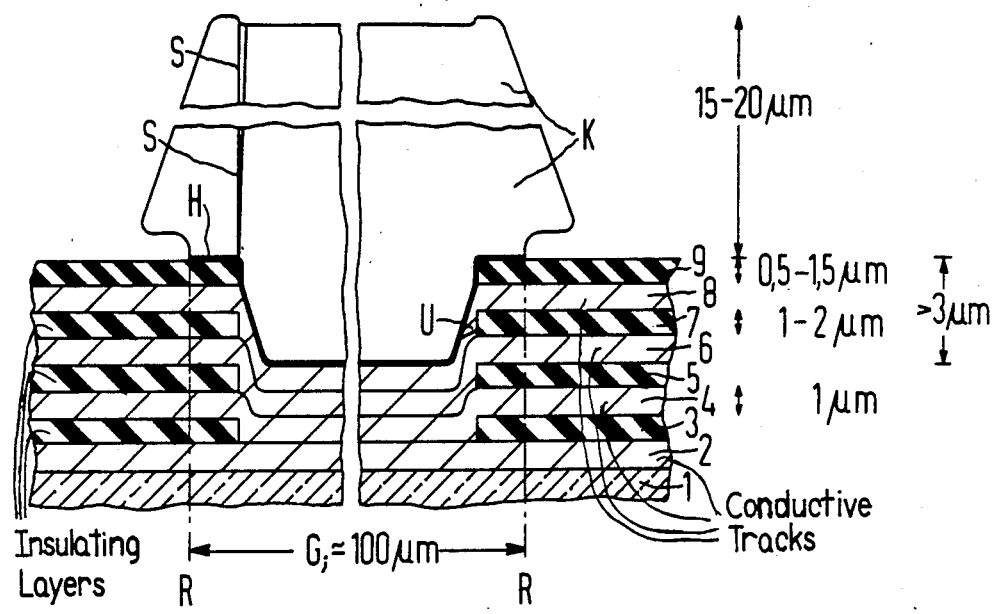
FIG. 1 is a cross-sectional view of a semiconductor component according to the prior art and illustrates a connection between a bump-like metallic lead contact and a plurality of conductive tracks in a multi-layer wiring system of the semiconductor component.

In the region illustrated, the semiconductor component of the invention shown in FIG. 2 contains a bump-like, metallic lead contact K comprising the thin adhesion layer H, and further contains tracks 2, 4, 6, and 8 and insulating layers 3, 5, and 7 following thereupon together with a final passivation 9. The respective distances between the ends of the individual insulating layers 3, 5, and 7 and an imaginary, vertical projection line R of the edge of the area G of the lead contact K (area projection) diminish in step-like fashion from top to bottom on a base layer 1, so that the ends of the insulating layers 3, 5, and 7 form a funnel that tapers in step-like fashion toward the bottom. During manufacture of the semiconductor component of the invention, a track 2 consisting, for example, of aluminum is applied in surface-wide fashion to the base layer 1, for example an oxide layer. A first insulating layer 3 having a thickness of at most 2 $\mu$m but preferably 1 $\mu$m is first applied in surface-wide fashion to the track 2. This insulating layer 3 can, for example, consist of polyimide lacquer and can be applied in accordance with standard lacquering techniques. This insulating layer 3 is then in turn removed in the region around the projection line R of the downwardly projection edge of the area G of the future lead contact K, and is removed in accordance with standard photolithographic processes, for example by means of etching, so that the track 2 lying therebelow is partially exposed. A second track 4 is now applied, again in surface-wide fashion, the second track 4, of course, forming a step with the edge of the insulating layer which arose by means of the aforedescribed stripping process. The step is not bothersome, however, due to its slight height equal to or less than 2 $\mu$m, and preferably equal to or less than 1 $\mu$m. An insulating layer 5 is then in turn applied in surface-wide fashion to this track 4. The part of the insulating layer 5 lying above the stripped region of the insulating layer 3 as well as an additional region following laterally thereupon are then in turn stripped, the width of the additional region amounting to at least twice the thickness of the region or of the previously applied insulating layer 3. When the insulating layers 3 and 5 have different thicknesses, then the thicker of the two insulating layers 3 and 5 is preferably used as a reference measure for the part to be additionally stripped. Analogous to the track 4 and the insulating layer 5, further tracks and insulating layers are subsequently applied in alternating fashion, and the insulating layers are correspondingly stripped in part until all required tracks have been applied to the semiconductor component. Finally, a so-called final passivation layer 9 is then applied, this being in turn stripped below the area G of the future lead contact K in a region that is smaller than that of area G and which receives a projection portion of contact K which is to be in contact with the uppermost track 8. As initially described, the adhesion layer and the lead contacts K are then applied. It must be mentioned that the number of tracks is not restricted to the four layers shown in the figures. The dimensions of the lead contacts, the tracks and insulating layers are likewise merely exemplary. Each of the insulating layers 3, 5, and 7, however, should be at most 2 $\mu$m thick, preferably even at most 1 $\mu$m thick in the illustrated environment of the lead contacts K. In this fashion, all tracks 2, 4, 6, and 8 come to lie under the lead contacts K and, on the other hand, steps that are too high, as shown in FIG. 1 as prior art, are avoided at the ends of the insulating layers 3, 5, and 7. Furthermore, each of the steps which occurs at the surface of the semiconductor component of the invention on the final passivation layer 9 in the environment of the lead contacts K is at most exactly as high as the thickness of the thickest of the insulating layers 3, 5, and 7. Due to the arrangement of the invention the insulating layers 3, 5, and 7 are thus the track interruptions, are reliably avoided at the tracks 4, 6, and 8, and sputtering gaps S and voids are reliably prevented at the lead contacts K.

The embodiment of the invention in FIG. 3 is designed quite similarly. The faces of those parts of the individual insulating layers 3, 5, and 7 to be stripped are merely not enlarged from bottom to top in the region of the lead contacts K, as shown in FIG. 2, but, inversely from top to bottom are likewise enlarged in step-shaped fashion like a funnel.

Although various minor changes and modifications might be proposed by those skilled in the art, it will be understood that I wish to include within the claims of the patent warranted hereon all such changes and modifications as reasonably come within my contribution to the art.

I claim as my invention:

1. In a semiconductor component contact structure a multi-layer wiring formed of a plurality of conductive tracks separated by insulating layers is provided on the semiconductor component, and wherein bump-like, metallic lead contacts are provided at contact locations, at a given contact location the lead contact being connected to a plurality of the conductive tracks through an aperture formed in a passivation layer lying over the multi-layer wiring, wherein the improvement comprises:

an area being defined by a maximum horizontal expanse of a portion of the lead contact in overlying contact with the final passivation layer;

insulating layers at said contact location lying outside of a vertical projection of said area;

the conductive tracks forming a layer sequence beneath the lead contact, the lead contact having a projection through the aperture of the passivation layer in electrical abutting contact with a top one of the conductive tracks; and the individual insulating layers terminating in the horizontal direction outwardly of and at different distances from the projection of said area.

2. The structure of claim 1 wherein said different distances of two neighboring insulating layers from said projection of said area is at least twice a layer thickness of one of said two insulating layers.

3. The structure of claim 2 wherein the two insulating layers have different thicknesses, and a thickness of the thicker of the two insulating layers is employed as a reference value for said difference in distance of the two insulating layers.

4. The structure of claim 1 wherein each of said insulating layers between said conductive tracks is at most 2 μm thick at regions surrounding said lead contact.

5. The structure of claim 1 wherein each of said insulating layers between said conductive tracks is at most 1 μm thick at regions surrounding said lead contact.

6. The structure of claim 1 wherein the ends of said insulating layers around said lead contact form funnels which taper down in step-like fashion.

7. The structure of claim 1 wherein the ends of said insulating layers around said lead contact form funnels which expand in a down direction in step-like fashion.

8. A semiconductor component structure, comprising:
a semiconductor body having a multi-layer wiring thereon formed of a plurality of conductive tracks with insulating layers therebetween;
at a contact location a metallic lead contact being formed which is electrically connected to a plurality of the conductive tracks;
a passivation layer lying over the multi-layer wiring, and at said contact location an aperture being provided therein such that a projecting portion of the lead contact projects through the aperture into contact with an upper one of said conductive tracks;
a mounting area being defined by a horizontal plane passing through the lead contact at a maximum expanse of a shoulder portion of the lead contact in overlying contact with the passivation layer at said aperture;
the insulating layers terminating outside of a vertical projection of said mounting area at said contact location;
the insulating layers terminating outwardly of and at differing lateral distances from said vertical projection of said area in step-like fashion; and
conductive extensions of each of said conductive tracks at said contact location each having steps in correspondence with steps of the insulating layers over which they lie.

9. The structure of claim 8 wherein adjacent insulating layers at the contact location have different distances from the vertical projection of said area, said different distances being at least twice a layer thickness of one of the two insulating layers.

10. A semiconductor component multilayer contacting system, comprising:
a bump-like, metallic lead contact;
a multilayer wiring on a base layer, said multilayer wiring comprising a plurality of stacked conductive tracks electrically separated from one another by a respective insulating layer;
said lead contact having a horizontal mounting surface area at which horizontal surfaces of said lead contact are in overlying contact with a final passivation layer lying over the multilayer wiring and also with a top one of said metallic tracks through an aperture in the passivation layer;
at a contact location for connection of respective conductive tracks to said lead contact each of the individual respective insulating layers associated with the conductive tracks laterally ending outwardly of a vertical area projection of said horizontal mounting surface area of the corresponding lead contact;
the conductive tracks at said contact location which are to be commonly connected to the lead contact being provided in layered fashion beneath the lead contact, and said lead contact having an extension portion contacting a top one of said metallic tracks at said location by extending through said aperture in said final passivation layer; and
said individual insulation layers ending at different distances from said vertical area projection.

11. A semiconductor component multilayer contacting system, comprising:
a base layer;
a multilayer wiring on the base layer comprising a plurality of stacked electriclly conductive tracks with a respective insulating layer between adjacent tracks;
a passivation layer over the multilayer wiring;
a contact location and a bump-like, metallic lead contact electrically connected at said contact location to conductive tracks to which it is to be commonly connected;
an aperture in the passivation layer, and said lead contact having an outer portion overlying and in contact with a top surface of the passivation layer and an extension portion received and extending through the aperture of the passivation layer and in contact with a top one of said conductive tracks;
a horizontal mounting surface area being defined by horizontal surfaces of the outer portion in contact with the passivation layer and extension portion in contact with the top one of said conductive tracks;
said insulating layers laterally ending outwardly of a vertical area projection of said horizontal mounting surface area down through the multilayer wiring; and
the insulating layers terminating outside the vertical area projection at increasingly greater distances so as to create a step pattern approaching the lead contact location.

* * * * *